United States Patent [19]

Abys et al.

[11] Patent Number: 4,911,798
[45] Date of Patent: Mar. 27, 1990

[54] PALLADIUM ALLOY PLATING PROCESS

[75] Inventors: Joseph A. Abys, Warren; Virginia T. Eckert, Summit; Catherine Wolowodiuk, Chatham Township, Morris County, all of N.J.

[73] Assignee: AT&T Bell Laboratories, Murray Hill, N.J.

[21] Appl. No.: 288,337

[22] Filed: Dec. 20, 1988

[51] Int. Cl.⁴ .......................... C25D 3/50; C25D 3/56
[52] U.S. Cl. .................................... 204/44; 204/43.1; 204/44.3; 204/44.6; 204/47
[58] Field of Search ................. 204/47, 44.6, 44, 44.3, 204/43.1

[56] References Cited

U.S. PATENT DOCUMENTS

| 4,066,517 | 1/1978 | Stevens et al. | 204/44.6 |
| 4,278,514 | 7/1981 | Morrissey | 204/47 |
| 4,339,311 | 7/1982 | Branik | 204/47 |
| 4,454,010 | 6/1984 | Trop | 204/47 |
| 4,486,274 | 12/1984 | Abys et al. | 204/44 |
| 4,778,574 | 10/1988 | Mathe et al. | 204/47 |

FOREIGN PATENT DOCUMENTS 2939920 9/1981 Fed. Rep. of Germany.
263354 2/1970 U.S.S.R. ............................... 204/47

OTHER PUBLICATIONS

Chem. Abstracts, vol. 72, p. 538, 38158g, (1970).

*Primary Examiner*—G. L. Kaplan
*Attorney, Agent, or Firm*—Walter G. Nilsen

[57] ABSTRACT

A process is described for electroplating palladium and palladium alloys. The process involves the use of an alkyl hydroxyamine as complexing agent and is particularly good for palladium alloys such as palladium-nickel and palladium-cobalt.

11 Claims, 2 Drawing Sheets

PALLADIUM ALLOY PLATING PROCESS

TECHNICAL FIELD

The invention involves a process for electroplating palladium and palladium alloys and articles made by this process.

BACKGROUND OF THE INVENTION

A large variety of articles are made in which precious metals are used as a protective coating. Particularly well known are jewelry articles where precious metal films are used to improve appearance and protect the surface from corrosion and discoloration. In many other applications, precious metal coatings are used for surface protection to prevent corrosion and at times to serve as a diffusion barrier as for example in the fabrication of various semiconductor devices. For various electrical and electronic devices, precious metal films are used for electrical conduction paths. In other electrical and electronic devices precious metal films are used as electrical contact surface. Gold is used in these applications with great success. However, it is highly desirable to obtain a material, equally effective as gold, which is less expensive and which can be electroplated faster and with greater ease.

Palladium and palladium alloys are used in a number of applications where chemical inertness, bright finish and high electrical conductivity are required. Palladium is used as a diffusion barrier in various applications, often as part of an electrode structure or electrical contact structure. Palladium metal and alloys are used as a protective coating on jewelry and various other articles. Palladium metal and alloys are also used in the electrical arts on contact surfaces, as electrical conduction paths and in optical devices.

Particularly attractive is the use of palladium and palladium alloys as electrical contact surfaces in the electrical arts. Palladium and palladium alloys are chemically inert, are hard and wear well and have good electrical conductivity. In addition, palladium and palladium alloys do not form oxide surface coatings that might increase surface contact resistance. Typical applications for electrical contact material are in electrical connectors, relay contacts, switches, etc. Various palladium alloys such as palladium-silver, palladium-nickel and palladium-copper are also useful in these applications. Indeed, where low cost is highly important, various palladium alloys such as palladium-nickel and other palladium alloys are often preferred. Particularly desirable is a process for electroplating palladium and palladium alloys from aqueous solutions which is rapid, inexpensive, easy to operate under manufacturing conditions and yields palladium and palladium alloy films that are ductile, adherent and free from hydrogen. In addition, in many applications, it is desirable that the bath not attack the metal being plated so that the bath remains uncontaminated over long periods of time. Also highly desirable is an alloy electroplating process in which the metal composition of the bath is close to the composition of the alloy being electroplated so that bath metal composition can be controlled during the electroplating process.

Palladium electroplating processes have been described in a number of references including U.S. Pat. No. 4,486,274 issued to J. A. Abys et al on Dec. 4, 1984. Also, references cited in this case such as U.S. Pat. No. 4,066,517 issued to Stevens et al in January 1978; U.S. Pat. No. 4,278,514 issued to Morrissey in July 1981 and U.S. Pat. No. 4,339,311 issued in July 1982 describe palladium electroplating processes but do not disclose the bath composition disclosed and claimed in the instant application.

SUMMARY OF THE INVENTION

The invention is a process for electroplating palladium and palladium alloys from an aqueous electroplating bath in which the electroplating bath comprises palladium in the form of a palladium complex ion and the complexing agent is an organic amine with one or more hydroxyl groups. Although both aliphatic and aromatic amines are contemplated, aliphatic hydroxyl amines are generally preferred. The complexing agent may contain other substituent groups besides the amine group and the hydroxyl group provided the resulting compound is stable under the electrochemical conditions of the electroplating process. Preferred is the compound tris-(hydroxylmethyl)aminomethane. It is preferred that the bath be alkaline (pH of 7.0 or greater) and sufficiently conductive to permit electroplating (generally conductivity greater than $10^{-3}$ mho-cm). Additional substances may be incorporated into the plating bath including substances to control and adjust the pH (such as a buffer), to increase conductivity and improve the properties of the plated metal or alloy. Although the process can be used to electroplate a variety of palladium alloys and palladium metal itself, it is particularly useful for palladium-nickel and palladium-cobalt alloys because the plating potential for the pairs of metals (e.g. palladium and nickel) are close together and well removed from the hydrogen evolution potential.

DETAILED DESCRIPTION

Figure 2:
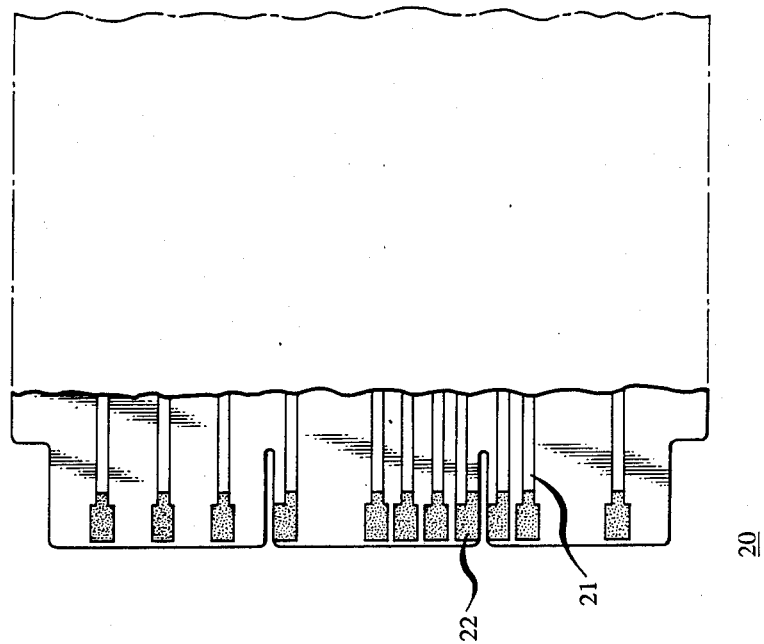
FIG. 2 shows a drawing of connector fingers on a circuit board electroplated in accordance with the invention.

An understanding of the invention is facilitated by setting forth in structural formula of one of the complexing agents.

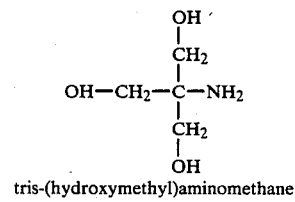

tris-(hydroxymethyl)aminomethane

The invention is based on the discovery that certain organic hydroxy alkyl amines are advantageously used as complexing agents in palladium and palladium alloy electroplating processes. Particularly advantageous is the use of these complexing agents for electroplating palladium alloys such as palladium-nickel and palladium-cobalt. These electroplating processes exhibit electroplating potentials far removed from the hydrogen evolution potential so as to prevent hydrogen embrittlement of the electroplated palladium. Also, for palladium alloy electroplating, the electroplating potential for palladium and the alloy metal (e.g. nickel or cobalt) are close together so that the metal composition of the electroplating bath and the metal composition of the alloy being plated are close together. Bath composition is more easily controlled where the metal composition of the alloy plated is close to the metal composition of the bath.

It is found that a certain class of complexing agents are advantageously used in the practice of the invention. This class is made up of hydroxy alkyl amines with up to 50 carbon atoms. Preferred complexing agents are those with up to 25 carbon atoms or even up to 10 carbon atoms. Alkyl hydroxyl amines with lower numbers of carbon atoms are more soluble in the bath solution and more likely to be liquid rather than solid at room temperature.

As regards the lower limit in the numbers of carbon atoms in the complexing agent, excellent results are obtained with 2 carbon atoms (e.g. hydroxymethyl aminomethane), 3 carbon atoms (e.g. 3 hydroxy-1-aminopropane, 2-hydroxy-1-aminopropane, etc.) and 4 carbon atoms. Preferred is at least 4 carbon atoms. Typical compounds are hydroxymethyl-dimethyl aminomethane, hydroxymethyl-ethyl aminomethane, hydroxyethylmethyl aminomethane, etc.

Generally, the complexing agents and corresponding metal complex used in the electroplating process should have a number of properties consistent with their use in a commercial electroplating process. They should be stable to ambient conditions so as to have long shelf life. They should be chemically stable to the components of the electroplating bath and also be stable to the (electrochemical) conditions of the electroplating process.

Particularly good results are obtained with alkyl amines with more than one hydroxyl group. Typical examples are bis-(hydroxymethyl) aminomethane and tris-(hydroxymethyl) aminomethane and the corresponding ethyl groups, namely bis-(hydroxyethyl) aminomethane and tris-(hydroxyethyl) aminomthane. Also, the corresponding propyl, butyl and pentyl compounds, both branched and straight-chained are useful.

Most preferred is the compound tris-(hydroxymethyl) aminomethane both because the electroplating potential for the palladium complex is well removed from the hydrogen evolution potential and the electroplating potential for alloying metals (e.g. nickel and cobalt) is close to the electroplating potential for the palladium complex. Typical alloying metals are silver, copper, nickel, cobalt, gold, chromium, manganese, ruthenium, rhodium, platinum and iridium. Particularly useful are copper, nickel, cobalt and silver. Preferred are alloys comprising at least 10 mole percent palladium, remainder copper, nickel, cobalt and/or silver. Other useful alloys are 40, 60 or 80 mole percent palladium, remainder silver, nickel, cobalt and/or silver. Often, the plated palladium or palladium alloy is at least partially covered with a thin (e.g. between 0.01 and 0.5 micrometer thick) layer of gold to improve corrosion resistance and wear resistance.

A large variety of counter ions (anions) may be used in the electroplating bath provided the anions are stable (chemically and electrochemically) and in particular are not subject to oxidation or reduction under conditions of the electroplating process. In addition, the anion should not interfere with the plating process by either chemical attack on the surface being plated or on the metal complex system. Typical anions are halides, nitrate, sulfate and phosphates. Chloride ion is preferred because of the low cost of various palladium chloride compounds and the stability of the chloride ion under conditions of the electroplating process. Also, certain ions, including those set forth above, may be used as supporting electrolyte to increase conductivity of the electroplating bath. The cation used for the supporting electrolyte may be any soluble ion which does not interfere with the electroplating process. Alkali-metal ions (Na, K, Li) are particularly preferred because of solubility and stability.

Various compounds may be used as a source of palladium in making up the electroplating bath. Particularly useful are chloride compounds such as palladium chloride, palladium diammine dichloride and alkali-metal tetrachloropalladates (e.g. $K_2PdCl_4$). The corresponding bromides and iodides are also useful but chlorides are usually more available. Particularly useful as a source of palladium is the hydroxide compound di-$\mu$-hydroxo-bis-[cis-diammine palladium (II)] dihydroxide. This compound can be used as the source of palladium to make up the initial solution and/or as a replenishment agent to add palladium to the electroplating bath. It should be realized that the species being reduced at the cathode during electroplating is the palladium-hydroxy amine complex outlined above. The alloying metal may be added in various forms such as chloride salt (e.g. $NiCl_2$), bromide salt, sulfate salt, sulfamate salt or the metal hydroxide. Again, it should be realized that the metal-hydroxy amine complex forms in the electroplating bath and this species is involved in the electroplating reaction.

Palladium electroplating baths with hydroxyl amine complexing agents as described above are highly advantageous for a number of reasons. Extremely high electroplating rates can be used without degradation of the quality of the plated palladium metal or alloy. Plating rates as high as 200 or even 500 or 2000 ASF yield excellent results as do lower plating rates of 0.01 to 50 or even 100 or 200 ASF. Also, the electroplating bath does not chemically attack surfaces being electroplated so that special precautions such as a separate electroplated layer of a protective metal are not necessary to avoid chemical attack prior to electrodeposition of the palladium metal or alloy.

The pH of the electroplating bath may vary over large limits consistent with the stability of the bath. Typically, a pH between 5 and 14 yields good results with the pH range greater than 7 preferred, the pH range from 7.5 to 12 more preferred and 8 to 10 most preferred. Generally, more basic bath solutions are preferred because of greater separation between plating potential and hydrogen evolution potential and greater chemical stability of the surface being plated toward the plating solution. Excessively high pH solutions are generally corrosive and more difficult to handle.

The plating process may be carried out with or without a buffer system. A buffer system is often preferred because it maintains constant pH and adds to the conductivity of the bath. Typical buffer systems are the phosphate system, borax, bicarbonate, etc. Preferred is the $HPO_4^{-2}/PO_4^{-3}$ system often made by adding an alkali-metal hydroxide (KOH, NaOH, etc.) to an aqueous solution of the hydrogen phosphate ion. Generally, the concentration of buffer varies from about 0.1 Molar to 2 Molar (about $1.0\pm0.2$ Molar preferred) and the mole ratio of hydrogen phosphate to phosphate varies from 5/1 to 1/5 (with equal mole amounts within ±50 percent preferred). These mole ratios as well as choice of the buffer system often depend on the particular pH desired for the plating bath.

The bath temperature may vary over large limits, typically from the freezing point to the boiling point of the electroplating bath. Often, the preferred plating temperature range depends on bath composition and concentration, plating cell design, pH and desired plating rate. Preferred temperatures for typical conditions are from room temperature to about 80° C. with 40° to 65° C. most preferred.

Various surfaces may be plated using the disclosed process. Usually, the plating would be carried out on a metal surface or alloy surface, but any conducting or partially conducting surface would appear sufficient. Also, electrolessly plated surfaces may be useful. Typical metal surfaces are copper, nickel, gold, platinum, palladium (as, for example, a surface electrolessly plated with palladium and then electroplated with palladium in accordance with the invention) and silver. Various alloy surfaces may also be used such as copper-nickel-tin alloys, beryllium-copper alloy, etc.

The concentration of the various substituents in the bath may vary over large limits. Only small amounts of palladium and alloying metal are necessary (e.g. 0.0001M) to produce electroplating and only a small fraction (e.g. 0.1) of the palladium and alloying metal need be complexed with the complexing agent. Usually, it is advantageous to use excess complexing agent although such is not necessary in the practice of the invention. Typical amounts of complexing agent is 0.01 to 10 times the mole amount of palladium and alloying metal with 0.5 to 5 times preferred.

The palladium concentration in the bath typically varies from 0.001 to saturation with 0.01 to 1.0 preferred and 0.1 to 0.5 most preferred. With alloy plating, the alloy metal or metals replaces part of the palladium metal in the plating bath. Generally, the composition of the alloy electroplated depends on various factors including temperature, plating rate and metal composition of the electroplating bath. For palladium alloy electroplating, the mole percent of palladium replaced by alloy metal or alloy metals typically may vary from about 10 mole percent to about 90 mole percent. Generally, 20 mole percent is preferred, particularly for high reliability electrical contacts. Typically 20 to 50 mole percent is preferred for many applications (e.g. decorative items such as spectacle frames) with 20 to 30 mole percent for high reliability electrical contacts. Nickel and cobalt are the preferred alloy metals both because of the ease of electroplating such alloys and the excellent properties of these alloys. Palladium alloys with more than one alloy metal (e.g. Pd-Ni-Co) are also useful.

Figure 1:
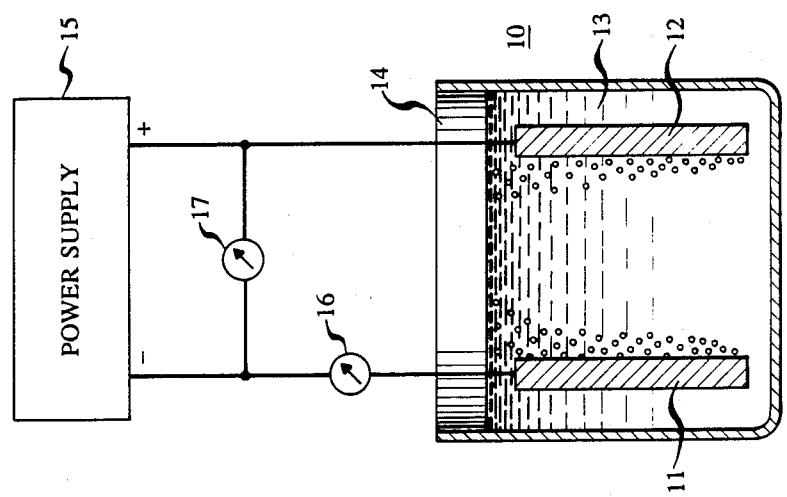
FIG. 1 shows a typical apparatus for electroplating palladium and a palladium alloy in accordance with the invention.

FIG. 1 shows apparatus 10 useful in the practice of the invention. The surface to be plated 11 is made the cathode in the electrolytic process. The anode 12 is conveniently made of platinized titanium or may be made of various other materials such as oxides of platinum group metals, binder metal oxides, etc. Both anode and cathode are partially immersed in the electroplating bath 13 containing source of palladium complex with an alkylhydroxyamine. A container is used to hold the palladium plating solution and the anode 12 and cathode 11 are electrically connected to source of electrical energy 15. An ammeter 16 and voltmeter 17 are used to monitor current and voltage. The voltage and current are controlled inside the source of electrical energy 15.

FIG. 2 shows a circuit board 20 with electrical contact fingers 21 partially covered with electroplated metal 22 comprising palladium.

Figure 3:
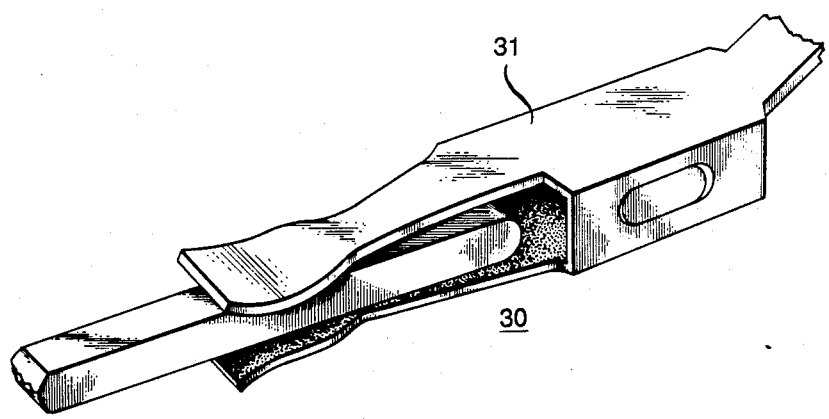
FIG. 3 shows a connector pin electroplated in accordance with the invention.

FIG. 3 shows 30 a connector 31 and mating compliant pin 32 in which surfaces are advantageously electroplated with palladium alloy and a thin layer of gold.

The bath may be prepared in a variety of ways well known in the art. Typically, an aqueous solution of the complexing agent is prepared and the source of palladium (e.g. $PdCl_2$) is added with stirring and optional heating. The solution is then filtered and diluted to the desired concentration.

Buffer may now be added (e.g. equal molar amounts of $K_3PO_4$) and the pH adjusted up by the addition of KOH and down by the addition of $H_3PO_4$.

Electroplating experiments are carried out in an electroplating cell provided with means for high agitation. The temperature is maintained between 50° and 65° C. Current is passed through anode, electroplating bath and cathode. The electrical energy is supplied by a conventional power supply. The current density is 175 ASF. Typical thicknesses in these experiments are 40 to 150 microinches. The deposit is crack free and adherence as well as ductility are excellent. In these experiments, the complexing agent is tris(hydroxymethyl)aminomethane, source of palladium is $PdCl_2$ and successive concentrations of palladium 0.0001, 0.001, 0.01, 0.1, 1.0 molar and saturation. Excellent results are also obtained using the following sources of palladium: $PdBr_2$, $PdI_2$, $PdSO_4$, $Pd(NH_3)_2Cl_2$, $Pd(NH_3)_2Br_2$ and $Pd(NH_3)_2I_2$).

Similar experiments were carried out on the following bath compositions:

EXAMPLE 1

Part of the palladium in the electroplating solution is replaced by the following metals: silver, copper, nickel, cobalt, gold, chromium, manganese, ruthenium, rhodium, platinum and iridium. Mole percent of palladium replaced by these metals were 10, 20, 30, 40, and 90. Electroplating was carried out at 65° C., 55° C. and room temperature.

EXAMPLE 2

Same as Example 1 with pH at 5, 6, 7, 8, 9, 10, 11, 12, 13 and 14.

EXAMPLE 3

Same as Example 1 with complexing agent on organic hydroxyl amine with 50 carbon atoms, 25 carbon atoms, 10 carbon atoms and 3 carbon atoms.

EXAMPLE 4

Same as Example 1 with the following complexing agents: bis-(hydroxymethyl)aminomethane, tris-(hydroxymethyl)aminomethane, bis-(hydroxyethyl)aminomethane, and tris-(hydroxyethyl)ammomethane.

EXAMPLE 5

Same as Example 1 with the concentration of complexing agent is 0.01, 0.1, 1.0, 10 times the concentration of palladium plus alloy metal.

We claim:
1. A process for electroplating a metallic substance, said metallic substance comprising palladium, comprising the step of passing current through a cathode, an electroplating bath and an anode with cathode potential great enough to electroplate palladium, said electroplating bath having a conductivity greater than $10^{-3}$ mho-cm and a pH greater than 5 characterized in that the electroplating bath comprises palladium complex ion in which the complexing agent comprises alkylhydroxy amines selected from the group consisting of bis-(hydroxymethyl)aminomethane, tris-(hydroxymethyl)aminomethane, bis-(hydroxyethyl)aminomethane and tris-(hydroxyethyl)aminomethane.

2. The process of claim 1 in which the metallic substance consists essentially of palladium.

3. The process of claim 1 in which the metallic substance comprises, in addition to palladium, at least one metal selected from the group consisting of silver, copper, nickel, cobalt, gold, chromium, manganese, ruthenium, rhodium, platinum and iridium.

4. The process of claim 3 in which the metallic substance comprises, in addition to palladium, at least one metal selected from the group consisting of copper, nickel, cobalt and silver.

5. The process of claim 4 in which the metallic substance comprises, in addition to palladium, at least one metal selected from the group consisting of nickel and cobalt.

6. The process of claim 1 in which the complexing agent comprises tris-(hydroxymethyl)aminomethane.

7. The process of claim 1, in which the palladium concentration in the bath solution in terms of palladium is from 0.0001M to saturation.

8. The process of claim 7 in which the concentration of palladium varies from 0.01M to 1.0M.

9. The process of claim 1 in which the mole percent of palladium replaced by alloying metal is from 10 to 90 mole percent.

10. The process of claim 9 in which the mole percent of palladium replaced by alloying metal is from 20 to 50 mole percent.

11. The process of claim 1 in which the concentration of complexing agent is from 0.01 to 10 times the mole amount of palladium plus alloy metal in the bath.

* * * * *